United States Patent [19]

Im

[11] Patent Number: 5,978,950
[45] Date of Patent: Nov. 2, 1999

[54] POLYNOMIAL EVALUATOR FOR USE IN A REED-SOLOMON DECODER

[75] Inventor: Yong-Hee Im, Seoul, Rep. of Korea

[73] Assignee: Daewoo Electronics Co., Ltd., Seoul, Rep. of Korea

[21] Appl. No.: 08/767,064

[22] Filed: Dec. 16, 1996

[30] Foreign Application Priority Data

Jul. 1, 1996 [KR] Rep. of Korea .................. 96-26590

[51] Int. Cl.⁶ .................... H03M 13/00; G06F 11/10
[52] U.S. Cl. .................... 714/752; 714/784; 714/781
[58] Field of Search .................... 371/37.01, 37.11, 371/37.12; 714/752, 784, 786

[56] References Cited

U.S. PATENT DOCUMENTS

| | | | |
|---|---|---|---|
| 4,162,480 | 7/1979 | Berlekamp | 340/146.1 |
| 4,649,541 | 3/1987 | Lahmeyer . | |
| 4,873,688 | 10/1989 | Maki et al. | 371/37.11 |
| 4,958,348 | 9/1990 | Berlekamp et al. | 714/752 |
| 5,323,402 | 6/1994 | Vaccaro et al. | 714/752 |
| 5,644,695 | 7/1997 | Blaum et al. | 714/6 |
| 5,742,620 | 4/1998 | Iwamura | 371/37.11 |
| 5,771,244 | 6/1998 | Reed et al. | 371/37.01 |

OTHER PUBLICATIONS

R.T. Chien, "Cyclic Decoding Procedures for Bose–Chaudhuri–Hocquenghem Codes" IEEE Transactions on Information Theory, vol. 10, 1964, pp. 357–363.

G.C. Clark et al., Error Correction Coding for Digital Communications, Chapter 5, Algebraic Techniques for Multiple Error Correction, pp. 188–195.

*Primary Examiner*—Phung M. Chung
*Assistant Examiner*—Shelly A Chase
*Attorney, Agent, or Firm*—Pennie & Edmonds LLP

[57] ABSTRACT

A polynomial evaluator evaluates a polynomial P(X) and a differential polynomial P'(X) iteratively, by substituting X with $\alpha^{-(N-j)}$ in a jth iteration, to thereby provide $P(\alpha^{-(N-j)})$ and $P'(\alpha^{-(N-j)})$, wherein the evaluator has: an initialization block for generating T initial evaluating terms; a term updating block for updating T evaluating terms for each iteration, to thereby provide a jth set of T evaluating terms in the jth iteration; a multiplexor for selectively providing the T initial evaluating terms or the jth set of T evaluating terms; an addition block for determining a sum of the T evaluating terms of the jth set, to thereby provide a jth sum; an adder for adding a 0th coefficient of P(X) to the jth sum, to thereby provide $P(\alpha^{-(N-j)})$; a multiplexor for selecting odd evaluating terms among the jth set of evaluating terms; a multiplier for multiplying a jth modification term to each of the odd evaluating term, to thereby provide a jth group of differential evaluating terms; and an addition block for determining a sum of the differential evaluating terms of the jth group in the jth iteration, to thereby provide $P'(\alpha^{-(N-j)})$.

19 Claims, 4 Drawing Sheets

POLYNOMIAL EVALUATOR FOR USE IN A REED-SOLOMON DECODER

FIELD OF THE INVENTION

The present invention relates to an apparatus for correcting errors present in stored or transmitted data; and, more particularly, to an apparatus for evaluating both an error locator polynomial and a differential polynomial which are used in correcting errors in the data encoded by using a Reed-Solomon code.

DESCRIPTION OF THE PRIOR ART

Noises occurring during a process of transmitting, storing or retrieving data can in turn cause errors in the transmitted, stored or retrieved data. Accordingly, various encoding techniques, having the capability of rectifying such errors, for encoding the data to be transmitted or stored have been developed.

In such encoding techniques, a set of check bits is appended to a group of message or information bits to form a codeword. The check bits, which are determined by an encoder, are used to detect and correct the errors. In this regard, the encoder essentially treats the bits comprising the message bits as coefficients of a binary message polynomial and derives the check bits by multiplying the message polynomial i(X) with a code generating polynomial g(X) or dividing i(X) by g(X), to thereby provide a codeword polynomial c(X). The code generating polynomial is selected to impart desired properties to a codeword upon which it operates so that the codeword will belong to a particular class of error-correcting binary group codes (see, e.g., S. Lin et al., "Error Control Coding: Fundamentals and Applications", Prentice-Hall, 1983).

One class of error correcting codes is the well-known BCH (Bose-Chaudhuri-Hocquenghen) code class, which includes the Reed-Solomon ("RS") code. The mathematical basis of the RS code is explained in, e.g., the aforementioned reference by Lin et al. and also in Berlekamp, "Algebraic Coding Theory", McGraw-Hill, 1968, which is further referred to in U.S Pat. No. 4,162,480 issued to Berlekamp.

If roots of the code generating polynomial g(X) of the RS code are 2T consecutive powers of $\alpha$ as in Eq. (1), as many as T errors can be corrected:

$$g(X) = \prod_{i=1}^{2T} (X - \alpha^i) \qquad \text{Eq. (1)}$$

wherein $\alpha$ is a primitive element in a finite field $GF(2^m)$.

In the process of receiving or retrieving a transmitted or stored codeword, certain attendant noises may have been converted to an error pattern in the codeword. In order to deal with the error pattern imposed upon the RS code, a four step procedure is generally utilized. In discussing the error-correcting procedure, reference shall be made to a RS code consisting of codewords containing N M-bit symbols (of which K symbols are informational symbols and (N–K) symbols are check symbols). In that case, c(X) becomes an (N–1)st order polynomial and 2T equals (N–K). As a first error correcting step, syndromes $S_0, S_1, \ldots, S_{2T-1}$ are calculated from a received codeword polynomial r(X), i.e., an (N–1)st order polynomial representing the received codeword. The received codeword polynomial r(X) is represented as $r_{N-1}X^{N-1} + r_{N-2}X^{N-2} + \ldots + r_1X^1 + r_0$, wherein $r_j$ is an (N–j)th symbol of a codeword. As a second step, using the syndromes, coefficients of an error locator polynomial $\sigma(X)$ are calculated. In a third step, the error locator polynomial $\sigma(X)$ is solved to obtain its roots, which represent the error locations in the received codewords. Specifically, if substituting a power of the primary element, $\alpha^{-j}$, for a variable X in the error locator polynomial $\sigma(X)$ results in 0 (i.e., $\alpha^{-j}$ becomes a root of $\sigma(X)$), it means that an error has occurred in $r_j$, i.e., a (N–j)th symbol of a codeword.

As a fourth step, error values are calculated by using the error locations and the syndromes. Mathematical expressions for the syndromes and the coefficients of the error locator polynomial are set forth in the afore-referenced U.S. Pat. No. 4,162,480 issued to Berlekamp.

The fourth step will be now explained in more detail.

First, an error evaluator polynomial $\Omega(X)$ may be obtained as follows:

$$\Omega(X) = \sigma(X)S(X) \qquad \text{Eq. (2)}$$

wherein S(X) is a syndrome polynomial whose coefficients are the syndromes.

After deriving the error evaluation polynomial $\Omega(X)$, an error value $e_j$ may be calculated as $$e_j = \alpha^j \frac{\Omega(\alpha^{-j})}{\sigma'(\alpha^{-j})} \qquad \text{Eq. (3)}$$

wherein $\sigma'(X)$ is the first derivative of the error locator polynomial $\sigma(X)$; $\alpha^{-j}$ is the root of the error locator polynomial obtained in the third step; and the error value $e_j$ corresponds to the (N–j)th symbol which is an error location obtained in the third step.

After finding the error values, the original codeword can be recovered by adding the error values to the corresponding symbols.

As explained above, polynomial evaluation is used in various stages of error correcting procedures, wherein the polynomial evaluation for $\alpha^{-j}$ refers to substitution of the finite field element $\alpha^{-j}$ for a variable X in a given polynomial p(X). First, the error locator polynomial $\sigma(X)$ is evaluated in the third step to find error locations. In the fourth step, the error evaluator polynomial $\Omega(X)$ and the differential polynomial $\sigma'(X)$ are evaluated to determine error values.

The error locator polynomial $\sigma(X)$ may be represented as $$\sigma(X) = \sum_{i=0}^{T} \sigma_i \cdot X^i \qquad \text{Eq. (4)}$$

Accordingly, evaluation $\sigma(X)$ for $\alpha^{-j}$ gives $$\sigma(\alpha^{-j}) = \sum_{i=0}^{T} \sigma_i \cdot (\alpha^{-j})^i \qquad \text{Eq. (5A)}$$

$$= \sum_{i=0}^{T} \sigma_i \cdot (\alpha^{-i})^j \qquad \text{Eq. (5B)}$$

wherein j is an integer ranging from 0 to N–1, and multiplications and additions are done on the finite field $GF(2^m)$. Evaluation results for other polynomials may be represented in a similar manner.

Referring to FIG. 1, there is shown an exemplary block diagram of a conventional polynomial evaluator 1 which is disclosed in a copending commonly owned application, U.S.

Ser. No. 08/755,579, entitled "Polynomial Evaluator for use in a Reed-Solomon Decoder". The evaluator shown in FIG. 1 evaluates the error locator polynomial $\sigma(X)$ by implementing Eq. (5B) in case of T=8.

At the polynomial evaluator 1, the calculation of Eq. (5B) is done iteratively from j=N−1 to 0 in that order, wherein an iteration may be preferably done in one system clock cycle.

The polynomial evaluator 1 includes an initialization block 10 for providing initial evaluating terms, a term updating block 30 for updating evaluating terms, a multiplexor 20 for providing the initial evaluating terms or the updated evaluating terms back to the term updating block 30, an addition block 40 for summing the evaluating values obtained in one iteration, an output block 50 and an error decision block 55, wherein the evaluating terms refer to $\sigma_i \alpha^{-ij}$'s included in Eq. (5B), j being updated for each iteration, and the initial evaluating values are $\sigma_i \alpha^{-iN}$'s.

Before starting a first iteration of the evaluation procedure for determining $\sigma(\alpha^{-(N-1)})$, registers included in a register block 30c of the term updating block 30 are initialized with a set of the 8 initial evaluating terms, i.e., $\sigma_i \alpha^{-iN}$'s, i being 1 to 8, provided from the initialization block 10.

To provide the initial evaluating terms, at a multiplier 10b operating on the finite field GF($2^m$) included in the initialization block 10, each coefficient of the error locator polynomial $\sigma_i$ is multiplied to $\alpha^{-iN}$, i being 1 to 8, wherein $\alpha^{-iN}$ is provided from a first root input block 10a. As a result, the multiplier 10b sequentially provide the set of the 8 initial evaluating terms, $\sigma_i \alpha^{-iN}$'s, to an input port 0 of MUX 20. For the initialization, MUX 20 directs $\sigma_i \alpha^{-iN}$ to the register block 30c. Specifically, a first initial evaluating term $\sigma_1 \alpha^{-N}$ is first fed to $R_1$ and stored therein for a bit clock cycle. The content of $R_1$ is shifted to $R_2$ and stored therein for a next bit clock cycle, and then to $R_3$, and so on. Finally, the output port of $R_8$ is connected to a multiplier 30a operating on the finite field GF($2^m$) included in the term updating block 30.

After each of the registers is filled with a corresponding initial evaluating term (e.g., $\sigma_1 \alpha^{-N}$ in $R_8$, $\sigma_2 \alpha^{-2N}$ in $R_7$, and so on), the first iteration for determining a first evaluation result $\sigma(\alpha^{-(N-1)})$ begins.

During a first bit clock of the first iteration, the multiplier 30a multiplies $\sigma_1 \alpha^{-N}$ provided thereto from $R_8$ with $\alpha^1$ fed from a second root input block 30b. The output of the multiplier 30a, e.g., $\sigma_1 \alpha^{-(N-1)}$ (or in other words, 1st evaluating term of a first set, the Kth set of evaluating terms referring to $\sigma_i \alpha^{-i(N-K)}$'s, K being 1 to N), is fed to the addition block 40 one per one bit clock cycle.

The addition block 40 includes a two input adder 40a and a register 40c, wherein the adder 40a operating on the finite field GF($2^m$) sequentially adds each of the evaluating terms of a same set provided from the multiplier 30a to the contents of the register 40c, and the register 40c stores a 1st to a 7th partial sums of the evaluating terms provided from the adder 40a and feeds the partial sum to the adder 40a, the Lth partial sum referring to sums of L evaluating terms included in a same set, L being 1 to 7, in the course of sequential addition of Eq. (5B). It also includes a multiplexor 40b for selectively providing 0 or the output of the adder 40a to the register 40c. MUX 40b provides 0 to the register 40c at the start of each iteration for the initialization of the register 40c and provides a partial sum provided from the adder 40a for the rest of time.

Specifically, upon receiving $\sigma_1 \alpha^{-(N-1)}$ from the multiplier 30a, the adder 40a adds it to the initial content, i.e., 0, of the register 40c. Then the 1st partial sum, $\sigma_1 \alpha^{-(N-1)}$, is fed back through MUX 40b to the register 40c, to be stored therein, e.g., at the rising edge of the next bit clock cycle. To do this, MUX 40b provides the output of the adder 40a to the register 40c.

Incidentally, $\sigma_1 \alpha^{-(N-1)}$ provided from the multiplier 30a is fed through MUX 20 to the register block 30c, to thereby shift the contents of each register to right, e.g., on the rising edge of a second bit clock cycle of the first iteration.

During the second bit clock cycle of the first iteration, the multiplier 30a multiplies $\sigma_2 \alpha^{-2N}$ provided thereto from $R_8$ with $\alpha^2$. The output of the multiplier 30a, i.e., $\sigma_2 \alpha^{-2(N-1)}$ at this time, is fed to the adder 40a, wherein it is added to the contents of the register 40c, i.e., $\sigma_1 \alpha^{-(N-1)}$. Then the second partial sum, $\sigma_1 \alpha^{-(N-1)} + \sigma_2 \alpha^{-2(N-1)}$, is fed back through MUX 40b to the register 40c, to be stored therein. $\sigma_2 \alpha^{-2(N-1)}$ from the multiplier 30a is fed through MUX 20 to the register block 30c, to thereby shift contents of each register to right on the rising edge of the next bit clock cycle.

By repeating the above procedure for the remaining bit clock cycles of the first iteration, terms $\sigma_1 \alpha^{-(N-1)}$ to $\sigma_8 \alpha^{-8(N-1)}$ are summed at the addition block 40. The adder 40a finally provides an 8th partial sum, i.e., a sum of the 8 evaluating terms ($\sigma_1 \alpha^{-(N-1)} + \sigma_2 \alpha^{-2(N-1)} + \ldots + \sigma_8 \alpha^{-8(N-1)}$) of the first set to the output block 50. The sum is fed to and stored in $R_{10}$ and then fed to an adder 50a wherein it is added to $\sigma_0$, to thereby provide the final result of the first iteration, i.e., the first evaluation result $\sigma(\alpha^{-(N-1)})$. At the same time, the register 40c is initialized with 0 provided from MUX 40b.

A second iteration is similar to the first iteration except that a second set of evaluating terms $\sigma_i \alpha^{-i(N-2)}$'s is provided from the multiplier 30a to the addition block 40 and back to the register block 30c. Specifically, $\sigma_1 \alpha^{-(N-1)}$ is multiplied with $\alpha^1$ during the first bit clock cycle, $\sigma_2 \alpha^{-2(N-1)}$ with $\alpha^2$ during the second bit clock cycle, and so on, to provide the second set of evaluating terms. By summing the second set of evaluating terms, $\sigma_i \alpha^{-i(N-2)}$'s, a second evaluation result $\sigma(\alpha^{-(N-2)})$ is obtained at the end of the second iteration. By repeating the above procedure, $\sigma(\alpha^{-j})$'s for j=N−) 1 to 0 are obtained in N iterations.

The contents of the registers $R_1$ to $R_8$ and $R_9$ for each bit clock cycle of the first to third iterations are shown in Table 1, wherein each row corresponds to each bit clock cycle.

TABLE 1

| iteration | $R_1$ | $R_2$ | ... | $R_8$ | $R_9$ |
|---|---|---|---|---|---|
| 1st | $\sigma_8 \alpha^{-8N}$ | $\sigma_7 \alpha^{-7N}$ | ... | $\sigma_1 \alpha^{-N}$ | 0 |
|  | $\sigma_1 \alpha^{-(N-1)}$ | $\sigma_8 \alpha^{-8N}$ |  | $\sigma_2 \alpha^{-2N}$ | $\sigma_1 \alpha^{-(N-1)}$ |
|  | . | . |  | . | . |
|  | . | . |  | . | . |
|  | $\sigma_7 \alpha^{-7(N-1)}$ | $\sigma_6 \alpha^{-6(N-1)}$ |  | $\sigma_8 \alpha^{-8N}$ | $\sigma_1 \alpha^{-(N-1)} + \ldots + \sigma_7 \alpha^{-7(N-1)}$ |
| 2nd | $\sigma_8 \alpha^{-8(N-1)}$ | $\sigma_7 \alpha^{-7(N-1)}$ | ... | $\sigma_1 \alpha^{-(N-1)}$ | 0 |
|  | $\sigma_1 \alpha^{-(N-2)}$ | $\sigma_8 \alpha^{-8(N-1)}$ |  | $\sigma_2 \alpha^{-2(N-1)}$ | $\sigma_1 \alpha^{-(N-2)}$ |
|  | $\sigma_2 \alpha^{-2(N-2)}$ | $\sigma_1 \alpha^{-(N-2)}$ |  | $\sigma_3 \alpha^{-3(N-1)}$ | $\sigma_1 \alpha^{-(N-2)} + \sigma_2 \alpha^{-2(N-2)}$ |

TABLE 1-continued

| iteration | $R_1$ | $R_2$ | ... $R_8$ | $R_9$ |
|---|---|---|---|---|
| | . | . | . | . |
| | . | . | . | . |
| | . | . | . | . |
| 3rd | $\sigma_7\alpha^{-7(N-2)}$ | $\sigma_6\alpha^{-6(N-2)}$ | $\sigma_8\alpha^{-8(N-1)}$ | $\sigma_1\alpha^{-(N-2)} + \ldots + \sigma_7\alpha^{-7(N-2)}$ |
| | $\sigma_8\alpha^{-8(N-2)}$ | $\sigma_7\alpha^{-7(N-2)}$ | ... $\sigma_1\alpha^{-(N-2)}$ | 0 |
| | $\sigma_1\alpha^{-(N-3)}$ | $\sigma_8\alpha^{-8(N-2)}$ | $\sigma_2\alpha^{-2(N-2)}$ | $\sigma_1\alpha^{-(N-3)}$ |
| | $\sigma_2\alpha^{-2(N-3)}$ | $\sigma_1\alpha^{-(N-3)}$ | $\sigma_3\alpha^{-3(N-2)}$ | $\sigma_1\alpha^{-(N-3)} + \sigma_2\alpha^{-2(N-3)}$ |
| | . | . | . | . |
| | . | . | . | . |
| | . | . | . | . |
| | $\sigma_7\alpha^{-7(N-3)}$ | $\sigma_6\alpha^{-6(N-3)}$ | $\sigma_8\alpha^{-8(N-2)}$ | $\sigma_1\alpha^{-(N-3)} + \ldots + \sigma_7\alpha^{-7(N-3)}$ |

The evaluation result is provided to an error decision block 55, wherein, in case $\sigma(\alpha^{-j})$ is 0, an error signal, which notifies that an error has occurred at a corresponding symbol $r_j$ of a codeword, is generated.

Referring to FIG. 2, there is provided a block diagram of a conventional polynomial evaluator 2, which evaluates the differential polynomial $\sigma'(X)$, i.e., the first derivative of the error locator polynomial $\sigma(X)$.

When the error locator polynomial is an 8th order polynomial represented as $$\sigma(x)=\sigma_0+\sigma_1 x+\sigma_2 x^2+\sigma_3 x^3+\sigma_4 x^4+\sigma_5 x^5+\sigma_6 x^6+\sigma_7 x^7+\sigma_8 x^8, \quad \text{Eq. (6)}$$

the differential polynomial is given as $$\sigma'(x)=\sigma_1+2\sigma_2 x^1+3\sigma_3 X^2+4\sigma_4 x^3+5\sigma_5 x^4+6\sigma_6 x^5+7\sigma_7 x^6+8\sigma_8 x^7 \quad \text{Eq. (7A)}$$

Since two identical numbers in the finite field yield 0, Eq. (7A) is further simplified as $$\sigma'(x)=\sigma_1+\sigma_3 x^2+\sigma_5 X^4+\sigma_7 x^6 \quad \text{Eq. (7B)}$$

Accordingly, evaluating $\sigma'(X)$ for $\alpha^{-j}$ gives $$\sigma'(\alpha^{-j}) = \sum_{i=1,(i=odd)}^{T} \sigma_i \cdot (\alpha^{-(i-1)})^j \quad \text{Eq. (7C)}$$

The structure of the evaluator is modified to correspond to Eq. (7C), which distinguishes the evaluator 2 from the evaluator 1. Specifically, since a differential evaluation result, which refers to an evaluation result of the differential polynomial, includes only even powers of $\alpha$ in Eq. (7C), root input blocks 60b and 90a provides only even powers of $\alpha$, i.e., ($\alpha^0$, $\alpha^2$, $\alpha^4$, $\alpha^6$) and ($\alpha^0$, $\alpha^{-2N}$, $\alpha^{-4N}$, $\alpha^{-6N}$), respectively; the register block 60c includes half as many registers as those of the evaluator 1 shown in FIG. 1; only coefficients of odd power terms, e.g., $\sigma_1$, $\sigma_3$, $\sigma_5$, $\sigma_7$ are provided to a multiplier 90b; and an output block 80 does not include an adder, for the 0th coefficient ($\sigma_0$) is not included in the differential evaluation result. Except these, overall operation of the evaluator is similar to that of FIG. 1. As explained above, though the structure of the two evaluators are similar, values, e.g., the evaluating terms and the partial sums, processed therein are different.

Incidentally, Eq. (7C) can be modified as follows:

$$\sigma'(\alpha^{-j}) = \sum_{i=0,(i=odd)}^{T} \alpha^j \cdot \sigma_i \cdot (\alpha^{-i})^j \quad \text{Eq. (7D)}$$

From Eq. (7D), it can be known that evaluating terms for odd powers of the error locator polynomial may be used in evaluating the differential equation.

However, in accordance with the conventional polynomial evaluator, the evaluators for evaluating the error locator polynomial and the differential polynomial are separately provided, to thereby render the structure of the polynomial evaluator complicated and, which may, in turn, makes it rather difficult to implement it by using a VLSI (Very Large Scale Integrating) technology.

SUMMARY OF THE INVENTION

It is, therefore, a primary object of the present invention to provide a polynomial evaluator which provides evaluation results for the error locator polynomial and the differential polynomial at the same time.

In accordance with the present invention, there is provided an apparatus, for use in a Reed-Solomon decoder, for evaluating a polynomial P(X) and a differential polynomial P'(X) iteratively, by substituting $\alpha^{-(N-j)}$ for X in a jth iteration, to thereby provide a jth evaluation result $P(\alpha^{-(N-j)})$ and a jth differential evaluation result $P'(\alpha^{-(N-j)})$, wherein P(X) is a Tth order polynomial, T being a positive integer, P'(X) is a first derivative of P(X), j is an integer ranging from 1 to N, N being a predetermined positive integer, and $\alpha$ is a primitive element in a finite field $GF(2^m)$, said apparatus comprising:

a FIFO buffer having T memory means;

updating means for sequentially multiplying the contents of the FIFO buffer with a first group of elements in the finite field, to thereby provide a jth set of T evaluating terms during the jth iteration;

means for generating T initial evaluating terms;

means for selectively providing the T initial evaluating terms or the jth set of T evaluating terms to the FIFO buffer, to be stored therein;

an addition block for determining a sum of the T evaluating terms of the jth set, to thereby provide a jth sum;

an output block for adding a 0th coefficient of the polynomial to the jth sum, to thereby provide the jth evaluation result;

an odd term selection block for selecting odd evaluating terms among the jth set of evaluating terms, to thereby sequentially provide a jth class of odd evaluating terms in the jth iteration;

a term modification block for multiplying a jth modification term to each of the odd evaluating term of the jth class in the jth iteration, to thereby provide a jth group of differential evaluating terms; and an addition block for determining a sum of the differential evaluating terms of the jth group in the jth iteration, to thereby provide the jth differential evaluation result.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 3:
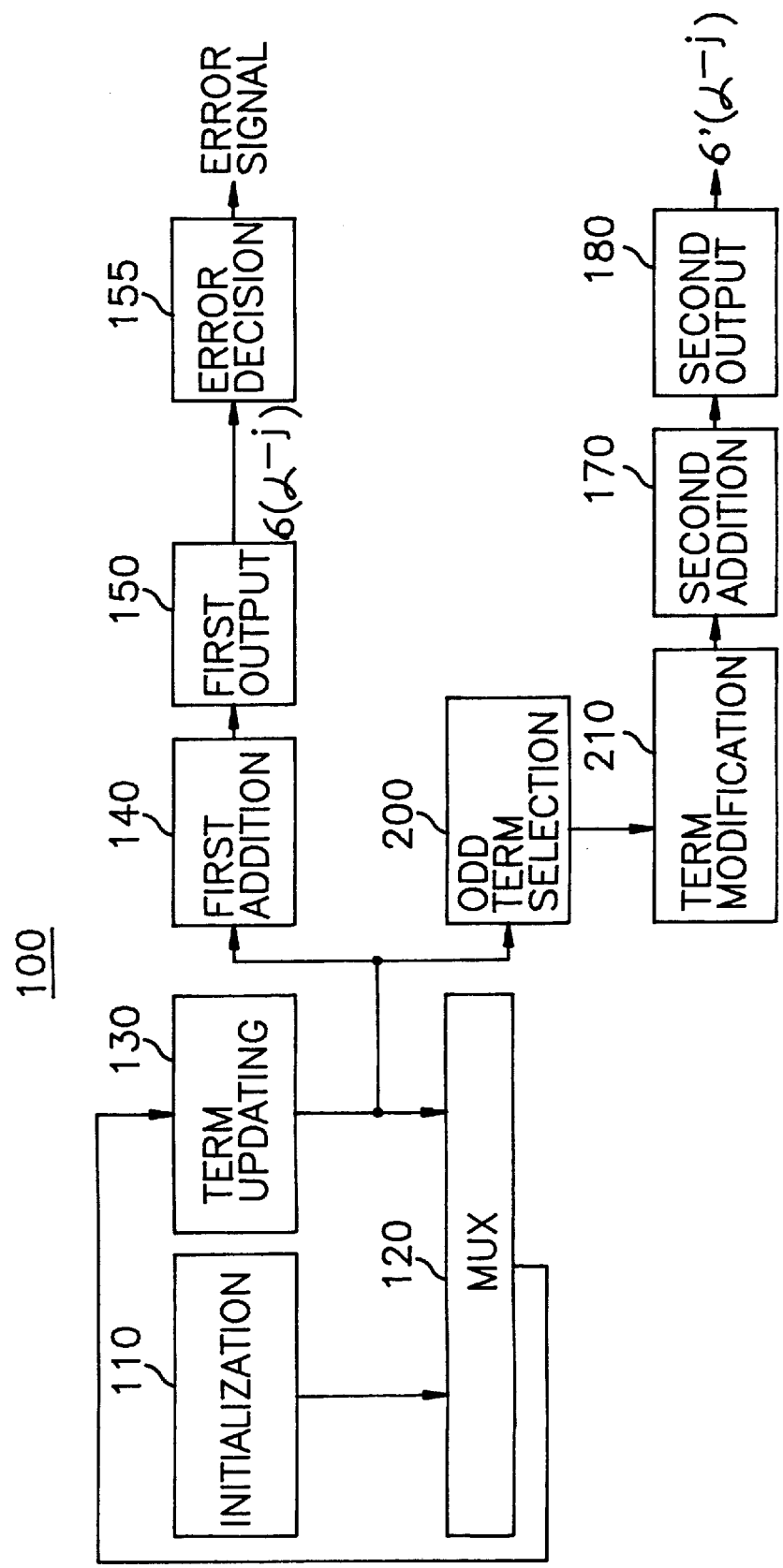
FIG. 3 presents a block diagram of a polynomial evaluator of the present invention for evaluating both the error locator polynomial and the differential polynomial.

Referring to FIG. 3, there is provided a block diagram of a polynomial evaluator 100 of the present invention, which evaluates both the error evaluator polynomial $\sigma(X)$ and the differential polynomial $\sigma'(X)$ according to $$\sigma(\alpha^{-j}) = \sum_{i=0}^{T} \sigma_i \cdot (\alpha^{-i})^j \quad \text{Eq. (5B)}$$

$$\sigma'(\alpha^{-j}) = \sum_{i=1,(i=odd)}^{T} \alpha^j \cdot \sigma_i \cdot (\alpha^{-i})^j \quad \text{Eq. (7D)}$$

for j=N−1 to 0, wherein T is set to be 8 for the purpose of illustration.

At the polynomial evaluator 100, the calculation of Eqs. (5B) and (7D) is done iteratively from j=N−1 to 0 in that order, wherein an iteration may be preferably done in one system clock cycle.

The polynomial evaluator 100 includes an initialization block 110, a multiplexor 120, a term updating block 130, a first addition block 140, a first output block 150 and an error decision block 155, which are used in evaluating the error locator polynomial. These blocks are essentially identical to corresponding blocks of the conventional evaluator 1 shown in FIG. 1. Accordingly, by the procedures explained with reference to FIG. 1, an evaluation result $\sigma(\alpha^{-j})$ is provided from the first output block 150 and an error signal is provided from the error decision block 155.

Figure 1:
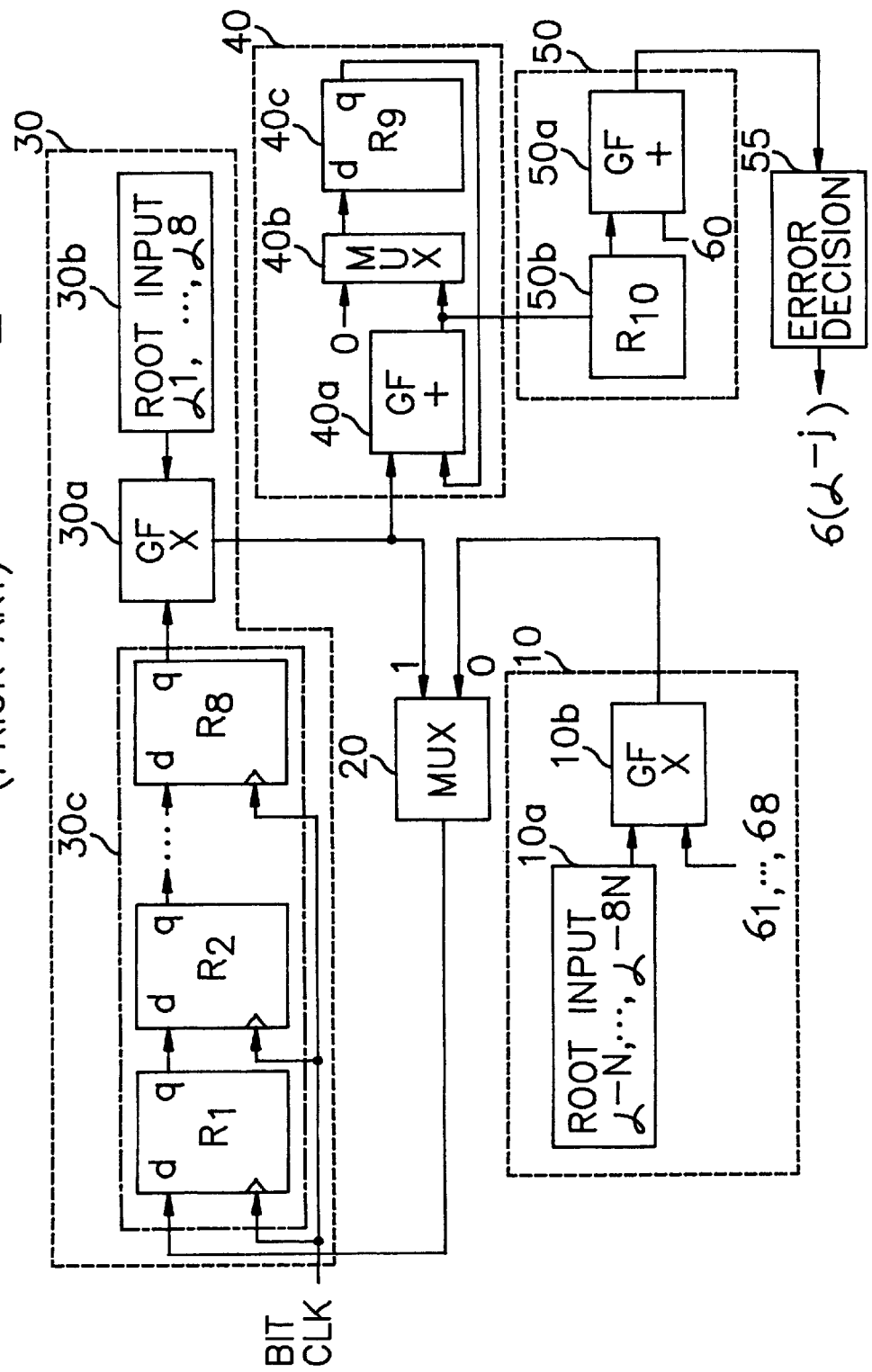
FIG. 1 shows a block diagram of a conventional polynomial evaluator for evaluating the error locator polynomial.

By the procedures explained with reference to FIG. 1, the term updating block 130 provides each set of the evaluating terms for each iteration. The set of 8 evaluating terms provided from the term updating block 130 are further used in evaluating the differential polynomial. To evaluate the differential polynomial, the evaluator 100 further includes an odd term selection block 200, a term modification block 210, a second addition block 170 and a second output block 180.

To begin with, at the odd term selection block 200, a group of 4 odd evaluating terms, which refer to the evaluating terms corresponding to odd power terms of the error locator polynomial, i.e., $\sigma_1 \alpha^{-j}$, $\sigma_3 \alpha^{-3j}$, $\sigma_5 \alpha^{-5j}$, and $\sigma_7 \alpha^{-7j}$, j being 0 to (N−1), is selected among the set of 8 evaluating terms of the error locator polynomial. The group of odd evaluating terms is fed to the term modification block 210, wherein each of the terms is multiplied with $\alpha^j$, to provide a group of differential evaluating terms, i.e., $\sigma_1 \alpha^0$, $\sigma_3 \alpha^{-2j}$, $\sigma_5 \alpha^{-4j}$, and 94 $_7\alpha^{-6j}$, j being 0 to (N−1), wherein the differential evaluating term refers to each term included in Eq. (7B). The 4 differential evaluating terms provided from the term modification block 210 are summed at the second addition block 170, to thereby provide a differential evaluation result $\sigma'(\alpha^{-j})$. The differential evaluation results are stored at the second output block 180 to be used in correcting errors in a RS decoder.

Figure 4:
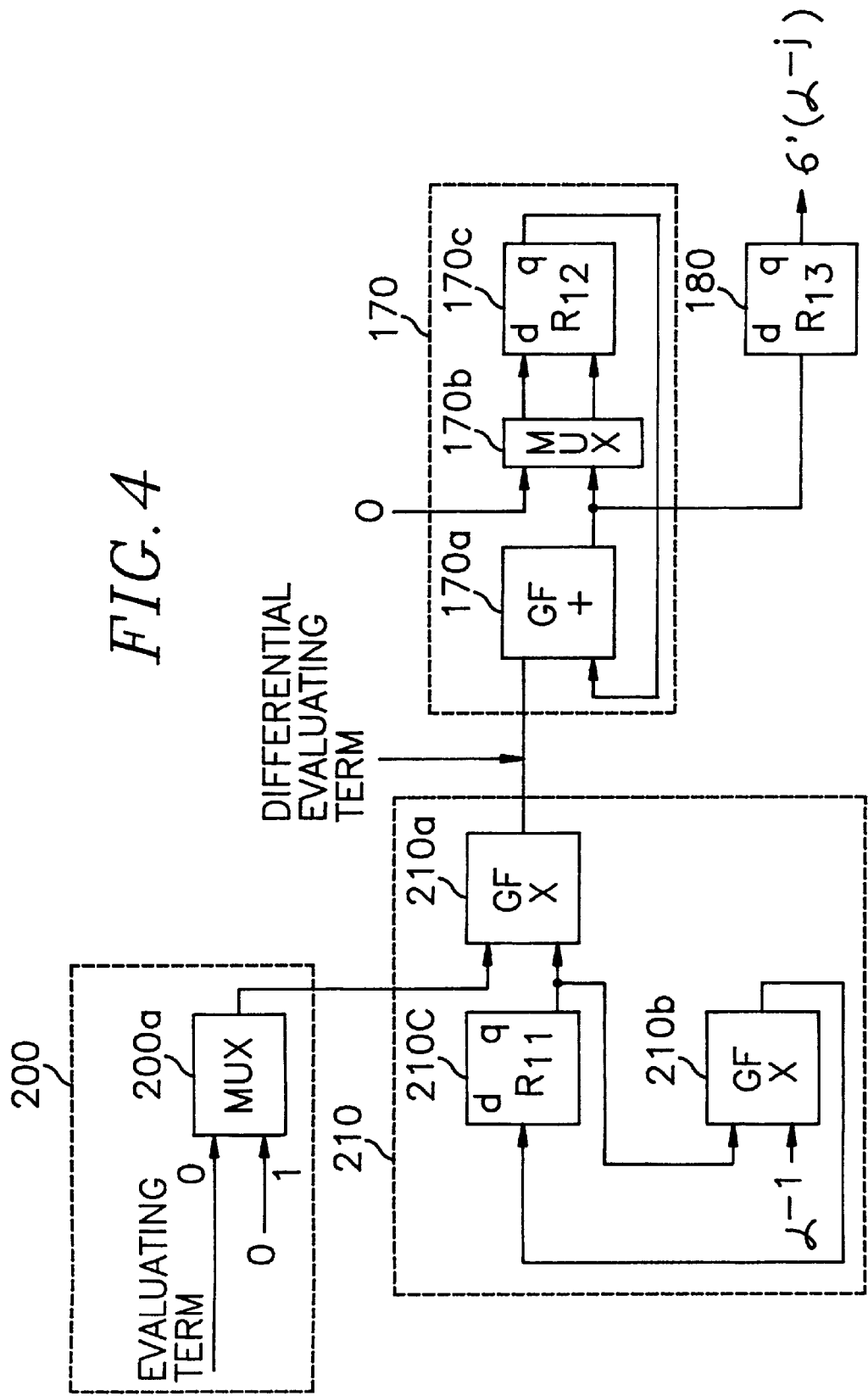
FIG. 4 provides a detailed block diagram of an odd term selection block, a term modification block, a second addition block and a second output block shown in FIG. 3.

With reference to FIG. 4, there is shown a detailed block diagram of a part of the evaluator 100, whose function is to obtain the differential evaluation result by using the evaluating terms of the error locator polynomial provided from the term updating block 130.

The odd term selection block 200 includes a multiplexor 200a which selectively provides the evaluating term provided from the term updating block 130 or 0 to the term modification block 210. Specifically, in case an odd evaluating term is provided to an input port 0 of MUX 200a, it provides the odd evaluating term to the term modification block 210; otherwise it provides 0 inputted on an input port 1 to the term modification block 210. Accordingly, values provided from MUX 200a during an (N−j)th iteration are "$\sigma_1 \alpha^{-j}$, 0, $\sigma_3 \alpha^{-3j}$, 0, $\sigma_5 \alpha^{-5j}$, 0, $\sigma_7 \alpha^{-7j}$, and 0" in that order.

The term modification block 210 includes a register $R_{11}$ for storing a modification term, a multiplier 210b operating on the finite field GF($2^m$) for updating the modification term and a multiplier 210a operating on the finite field for multiplying the modification term with each of the odd evaluating terms provided from the odd term selection block 200. The modification term refers to $\alpha^j$ which is to be multiplied with each odd term for the (N−j)th iteration at the multiplier 210a, to form a differential evaluating term as shown in Eq. (7D). Since an initial modification term, i.e., the modification term for the first iteration, is $\alpha^{(N-1)}$, $R_{11}$ register 210c is initialized with $\alpha^{(N-1)}$ before the first iteration. At the start of a second iteration, (or at the end of the first iteration) the initial modification term is multiplied with $\alpha^{-1}$ at the multiplier 210b to provide the modification term for the second iteration, i.e., $\alpha^{(N-2)}$. Similarly, the modification term is updated once per each iteration. The updated modification term is fed back to $R_{11}$ to be stored therein.

As described above, the multiplier 210a provides the group of differential evaluating terms for each iteration. More specifically, for (N−j)th iteration, the multiplier 210a provides "$\sigma_1$, 0, $\sigma_3 \alpha^{-2j}$, 0, $\sigma_5 \alpha^{-4j}$, 0, $\sigma_7 \alpha^{-6j}$, and 0" in that order.

Figure 2:
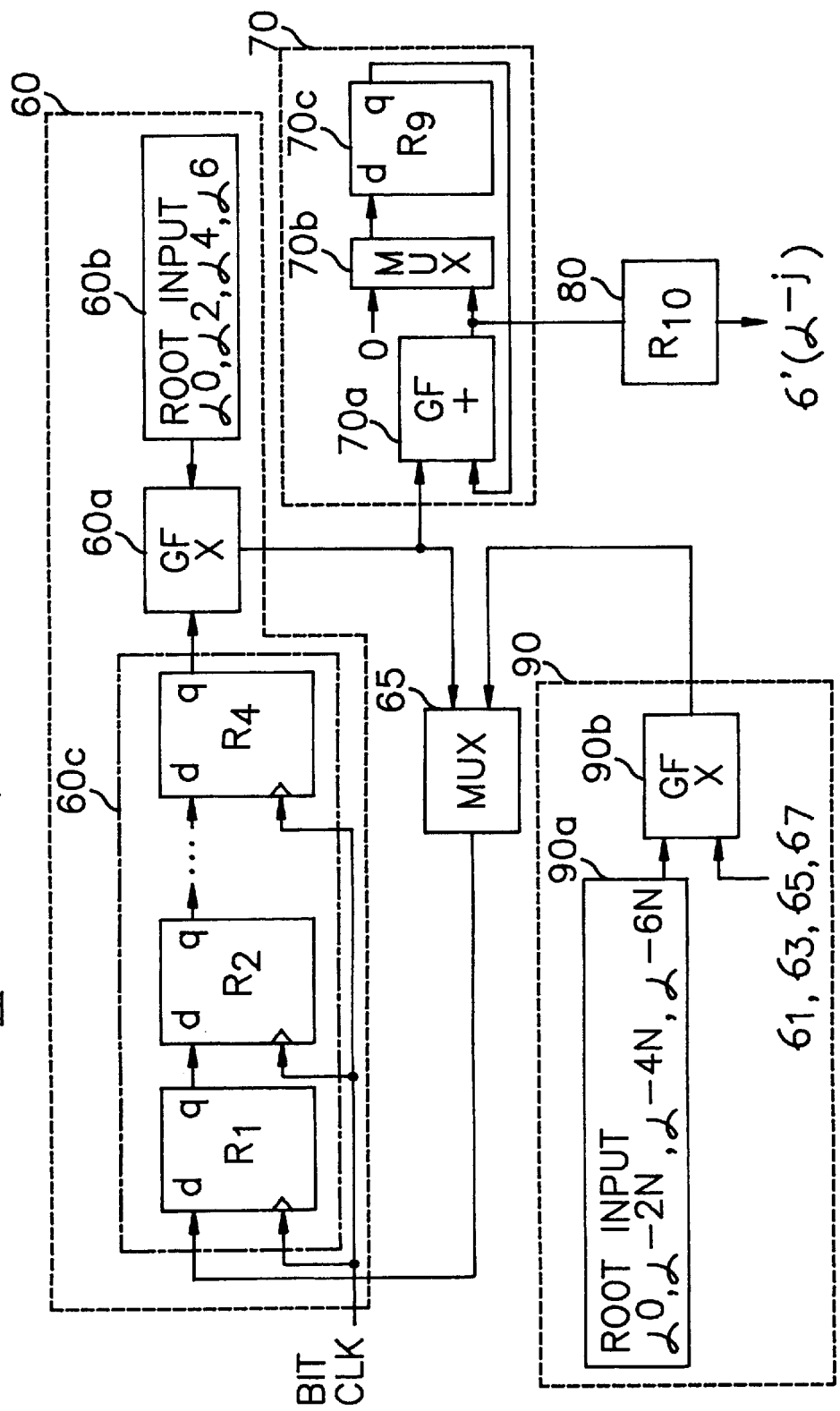
FIG. 2 describes a block diagram of a conventional polynomial evaluator for evaluating the differential polynomial.

The group of differential evaluating terms is provided to the addition block 170, wherein the terms are summed to form a differential evaluation result $\sigma'(\alpha^{-j})$. The addition block 170 operates in a similar manner to the addition blocks 40 or 70 shown in FIGS. 1 and 2, respectively. Therefore, at the end of (N−j)th iteration, an adder 170a included in the addition block 170 provides a jth differential evaluation result $\sigma'(\alpha^{-j})$ by summing 4 differential evaluating terms $\sigma_1$, $\sigma_3 \alpha^{-2j}$, $\sigma_5 \sigma^{-7j}$ and $\sigma_7 \alpha^{-6j}$. The differential evaluation result is fed to and stored in $R_{13}$ register 180, to be used in an error correcting process.

The contents of $R_{11}$ and $R_{12}$ are given in Table 2. As 0 is provided from the term modification block 210 to the adder 170a every other bit clock cycle, the contents of $R_{12}$ is changed once per 2 bit clock cycles.

While the present invention has been described with respect to the particular embodiments, it will be apparent to those skilled in the art that various changes and modifications may be made without departing from the spirit and scope of the invention as defined in the following claims.

TABLE 2

| iteration | $R_{11}$ | $R_{12}$ |
|---|---|---|
| 1st | $\alpha^{(N-1)}$ | 0 |
|  |  | $\sigma_1$ |
|  |  | $\sigma_1$ |
|  |  | $\sigma_1 + \sigma_3\alpha^{-2(N-1)}$ |
|  |  | $\sigma_1 + \sigma_3\alpha^{-2(N-1)}$ |
|  |  | $\sigma_1 + \sigma_3\alpha^{-2(N-1)} + \sigma_5\alpha^{-4(N-1)}$ |
|  |  | $\sigma_1 + \sigma_3\alpha^{-2(N-1)} + \sigma_5\alpha^{-4(N-1)}$ |
|  |  | $\sigma_1 + \sigma_3\alpha^{-2(N-1)} + \sigma_5\alpha^{-4(N-1)} + \sigma_7\alpha^{-6(N-1)}$ |
| 2nd | $\alpha^{(N-2)}$ | 0 |
|  |  | $\sigma_1$ |
|  |  | $\sigma_1$ |
|  |  | $\sigma_1 + \sigma_3\alpha^{-2(N-2)}$ |
|  |  | $\sigma_1 + \sigma_3\alpha^{-2(N-2)}$ |
|  |  | $\sigma_1 + \sigma_3\alpha^{-2(N-2)} + \sigma_5\alpha^{-4(N-2)}$ |
|  |  | $\sigma_1 + \sigma_3\alpha^{-2(N-2)} + \sigma_5\alpha^{-4(N-2)}$ |
|  |  | $\sigma_1 + \sigma_3\alpha^{-2(N-2)} + \sigma_5\alpha^{-4(N-2)} + \sigma_7\alpha^{-6(N-2)}$ |

What is claimed is:

1. An apparatus, for use in a Reed-Solomon decoder, for evaluation a polynomial P(X) and a differential polynomial P'(X) iteratively, by substituting $\alpha^{-(N-j)}$ for X in a jth iteration, to thereby provide a jth evaluation result $P(\alpha^{-(N-j)})$ and a jth differential result $P'(\alpha^{-(N-j)})$, wherein P(x)'s a Tth order polynomial, T being a positive integer, P'(X) is a first derivative of P(X), j is an integer ranging from 1 to N, N being a predetermined positive integer, and $\alpha^-$ is a primitive element in a finite field $GF(2^m)$, said apparatus comprising:

a FIFO buffer having T memory means, T being a predefined positive integer;

updating means for sequentially multiplying the contents of the FIFO buffer with a first group of elements in the finite field, to thereby provide a jth set of T evaluating terms during the jth iteration;

means for generating T initial evaluating terms;

means for selectively providing the T initial evaluating terms or the jth set of T evaluating terms to the FIFO buffer, to be stored therein;

first addition means for determining a sum of the T evaluating terms of the jth set, to thereby provide a jth sum;

means for adding a 0th coefficient of the polynomial to the jth sum, to thereby provide the jth evaluation result;

first selection means for selecting odd evaluating terms among the jth set of evaluating terms, to thereby sequentially provide a jth class of odd evaluating terms in the jth iteration;

means for multiplying a jth modification term to each of the odd evaluating terms of the jth class in the jth iteration, to thereby provide a jth group of differential evaluating terms; and second addition means for determining a sum of the differential evaluating terms of the jth group in the jth iteration, to thereby provide the jth differential evaluation result, wherein said first selection means is configured to provide zero values between successive odd evaluating terms to said means for multiplying.

2. The apparatus of claim 1, wherein the generation means includes:

first input means for sequentially providing T elements in the finite field; and means for sequentially multiplying the T elements in the finite field provided from the first input means with first to Tth coefficients of the polynomial P(X), to thereby provide the T initial evaluating terms.

3. The apparatus of claim 2, wherein T elements provided from the first input means are $\alpha^i$'s, is being an integer ranging from 1 to T.

4. The apparatus of claim 1, wherein the updating means includes:

second input means for sequentially providing the T elements in the finite field in the jth iteration; and means for sequentially multiplying the contents of the FIFO buffer with the T elements in the finite field provided from the second input means, to thereby provide the jth set of T evaluating terms in the jth iteration.

5. The apparatus of claim 4, wherein the T elements provided from the second input means are $\alpha^{-iN}$'s, is being an integer ranging from 1 to T.

6. The apparatus of claim 1, wherein the first addition means includes:

an adder for adding an evaluating term provided from the updating means with a feedback value, to thereby provide a partial sum or the jth sum;

second selection means for selectively providing the partial sum provided from the adder or 0; and memory means for storing the partial sum or 0 provided from the second selection means and providing the partial sum or 0 as the feedback value to the adder.

7. The apparatus of claim 1, wherein the first selection means includes a multiplexor for selectively providing an odd evaluating term or 0.

8. The apparatus of claim 1, wherein the means for multiplying includes:

first memory means for storing a modification term;

means for renewing the modification term for each iteration and providing the renewed modification term to the first memory means to be stored therein; and means for multiplying the modification term stored at the first memory means with each of the odd evaluating terms of the jth class, to thereby provide the jth group of differential evaluating terms.

9. The apparatus of claim 8, wherein the renewal means contains means for multiplying $\alpha^{-1}$ with the modification term stored at the first memory means.

10. The apparatus of claim 8, wherein the first memory means is initialized with $\alpha^{N-1}$ and the jth modification term is $\alpha^{(N-j)}$.

11. The apparatus of claim 1, wherein the second addition means includes:

an adder for adding a differential evaluating term provided from the multiplication means with a feedback value, to thereby provide a partial sum or the jth differential evaluation result;

selection means for selectively providing the partial sum provided from the adder or 0; and memory means for storing the partial sum or 0 provided from the selection means and providing the partial sum or 0 as the feedback value to the adder.

12. The apparatus of claim 1, wherein the polynomial P(X) is an error locator polynomial of an order T.

13. The apparatus of claim 1 further comprising means for deciding whether the a jth evaluation result equals 0, to thereby provide an error signal.

14. An apparatus, for use in a Reed-Solomon decoder, for evaluating a polynomial P(X) and a differential polynomial P'(X) iteratively, by substituting $\alpha^{-(N-j)}$ for X in a jth iteration, to thereby provide a jth evaluation result $P(\alpha^{-(N-j)})$ and a jth differential result $P'(\alpha^{-(N-j)})$, wherein P(X) is a Tth order polynomial, T being a positive integer, P'(X) is a first derivative of P(X), j is an integer ranging from 1 to N, N being a predetermined positive integer, and $\alpha^-$ is a primitive element in a finite field $GF(2^m)$, said apparatus comprising:

- a FIFO buffer having T memory means, T being a predefined positive integer;
- means for initializing the FIFO buffer with T evaluating terms by sequentially providing the T initial evaluating terms to the FIFO buffer;
- updating means for sequentially multiplying the contents of the FIFO buffer with T elements in the finite field, to thereby provide a jth set of T evaluating terms during the jth iteration;
- means for sequentially providing the jth set of T evaluating terms in the jth iteration, to the FIFO buffer, to be stored therein;
- first addition means for determining a sum of the T evaluating terms of the jth set, to thereby provide a jth sum;
- means for adding a $0^{th}$ coefficient of the polynomial to the jth sum, to thereby provide the jth evaluation result;
- first selection means for selecting odd evaluating terms among the jth set of evaluating terms, to thereby sequentially provide a jth class of odd evaluating terms in the jth iteration;
- means for multiplying a jth modification term to each of the odd evaluating terms of the jth class in the jth iteration, to thereby provide a jth group of differential evaluating terms; and
- second addition means for determining a sum of the differential evaluating terms of the jth group in the jth iteration, to thereby provide the jth differential evaluation result,
- wherein said first selection means is configured to provide zero values between successive odd evaluating terms to said means for multiplying.

15. The apparatus of claim 14, wherein the updating means includes:

- first input means for sequentially providing the T elements in the finite field in the jth iteration; and
- means for sequentially multiplying the contents of the FIFO buffer with the T elements in the finite field provided from the first input means, to thereby provide the jth set of T evaluating terms in the jth iteration.

16. The apparatus of claim 14, wherein the first addition means includes:

- an adder for adding an evaluating term provided from the updating means with a feedback value, to thereby provide a partial sum or the jth sum;
- second selection means for selectively providing the partial sum provided from the adder or 0; and
- memory means for storing the partial sum or 0 provided from the second selection means and providing the partial sum or 0 as the feedback value to the adder.

17. The apparatus of claim 14, wherein the second addition means includes:

- an adder for adding a differential evaluating term provided from the multiplication means with a feedback value, to thereby provide a partial sum or the jth differential evaluation result;
- selection means for selectively providing the partial sum provided from the adder or 0; and
- memory means for storing the partial sum or 0 provided from the selection means and providing the partial sum or 0 as the feedback value to the adder.

18. The apparatus of claim 14, wherein the polynomial P(X) is an error locator polynomial of an order T.

19. The apparatus of claim 14 further comprising means for deciding whether the a jth evaluation result equals 0, to thereby provide an error signal.

* * * * *